(12) United States Patent
Gan et al.

(10) Patent No.: US 11,222,790 B2
(45) Date of Patent: Jan. 11, 2022

(54) TIE BAR REMOVAL FOR SEMICONDUCTOR DEVICE PACKAGING

(71) Applicant: NXP USA, INC., Austin, TX (US)

(72) Inventors: Richard Te Gan, Chandler, AZ (US); Rushik Prabhudas Tank, Chandler, AZ (US); Zhiwei Gong, Chandler, AZ (US); Burton Jesse Carpenter, Austin, TX (US); Jinmei Liu, Tianjin (CN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/862,027

(22) Filed: Apr. 29, 2020

(65) Prior Publication Data

US 2021/0202267 A1 Jul. 1, 2021

(30) Foreign Application Priority Data

Dec. 26, 2019 (CN) .......................... 201911373697.6

(51) Int. Cl.
*H01L 21/48* (2006.01)
*H01L 23/495* (2006.01)
*H01L 23/31* (2006.01)
*H01L 21/56* (2006.01)

(52) U.S. Cl.
CPC ...... *H01L 21/4842* (2013.01); *H01L 21/4825* (2013.01); *H01L 21/565* (2013.01); *H01L 23/3114* (2013.01); *H01L 23/49503* (2013.01); *H01L 23/49548* (2013.01)

(58) Field of Classification Search
CPC . H01L 24/48; H01L 21/4832; H01L 21/4842; H01L 21/565
See application file for complete search history.

(56) References Cited

U.S. PATENT DOCUMENTS

| | | | |
|---|---|---|---|
| 6,204,554 B1 * | 3/2001 | Ewer | H01L 23/49562 257/705 |
| 6,818,971 B2 | 11/2004 | Oda et al. | |
| 9,006,871 B2 * | 4/2015 | Fujisawa | H01L 23/49568 257/676 |
| 9,041,172 B1 | 5/2015 | Niu et al. | |
| 9,449,901 B1 * | 9/2016 | Wang | H01L 23/49551 |
| 10,043,721 B2 * | 8/2018 | Taguchi | H01L 24/32 |
| 10,199,303 B1 * | 2/2019 | Sanchez | H01L 21/4825 |
| 10,249,556 B1 | 4/2019 | Vareesantichai et al. | |
| 2015/0303133 A1 * | 10/2015 | Shih | H01L 24/83 257/676 |
| 2019/0067172 A1 * | 2/2019 | Carpenter | H01L 23/49548 |
| 2020/0203262 A1 * | 6/2020 | Ching, Jr. | H01L 23/3121 |
| 2020/0203289 A1 * | 6/2020 | Ching, Jr. | H01L 23/49541 |

\* cited by examiner

*Primary Examiner* — Zandra V Smith
*Assistant Examiner* — John M Parker (57) ABSTRACT

A method of tie bar removal is provided. The method includes forming a leadframe including a tie bar and a flag. The tie bar extends from a side rail of the leadframe and has a distal portion at an angle different from a plane of the flag. A semiconductor die is attached to the flag of the leadframe. A molding compound encapsulates the semiconductor die, a portion of the leadframe, and the distal portion of the tie bar. The tie bar is separated from the molding compound with an angled cavity remaining in the molding compound.

16 Claims, 6 Drawing Sheets

TIE BAR REMOVAL FOR SEMICONDUCTOR DEVICE PACKAGING

CROSS-REFERENCE TO RELATED APPLICATIONS

This application claims the priority under 35 U.S.C. § 119 of China application no. 201911373697.6, filed on 26 Dec. 2019, the contents of which are incorporated by reference herein.

BACKGROUND

Field

This disclosure relates generally to semiconductor devices, and more specifically, to tie bar removal for semiconductor device packaging.

Related Art

Semiconductor devices are often found in a large spectrum of electronic products—from sewing machines to washing machines, from automobiles to cellular telephones, and so on. Such semiconductor devices generally include an integrated circuit die which communicates with the other devices outside of a package by way of bond wires, for example. As technology progresses, semiconductor manufacturing continues to seek ways to reduce costs and improve reliability in these semiconductor devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a tie bar removal method for semiconductor device packaging. By forming a leadframe to facilitate tie bar separation, creepage distance can be increased while minimizing impact to package encapsulant. In one aspect, leadframe tie bars are bent at an angle different from the plane of a die flag. Separating the bent tie bars from the package encapsulant with a force applied in an opposite direction significantly improves package integrity and reliability. In another aspect, leadframe tie bars are encapsulated in a sacrificial portion of the molded package. Separating the sacrificial portion also removes the tie bars leaving minimal impact to the package encapsulant and improving overall package integrity and reliability.

Figure 1:
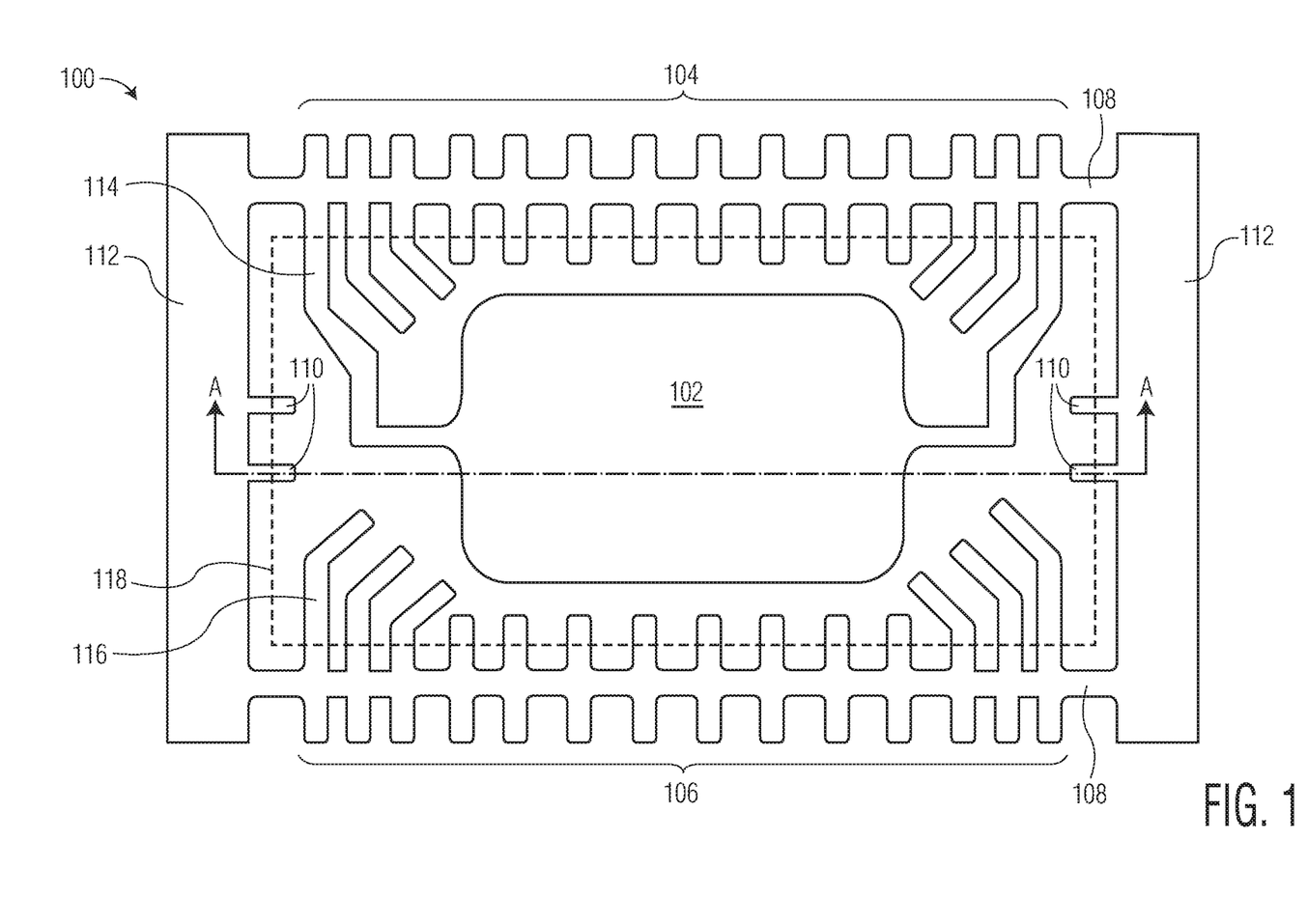
FIG. 1 illustrates, in a simplified plan view, a leadframe for an example semiconductor device at a stage of manufacture in accordance with an embodiment.

FIG. 1 illustrates, in a simplified plan view, a leadframe for an example semiconductor device 100 at a stage of manufacture in accordance with an embodiment. At this stage, semiconductor device 100 includes a leadframe. The leadframe is formed having a die attachment flag 102, a plurality of conductive leads including a first plurality of leads 104 and a second plurality of leads 106, side rails 112, dam bars 108 interconnected to the plurality of leads 104, 106 and side rails 112, and tie bars 110 extending from side rails 112. The leadframe may be formed from any suitable electrically conductive material, such as aluminum, copper, silver, nickel, or iron, or alloys thereof, for example. The conductive metal may be bare, partially plated, or plated with another metal or an alloy such as iron/nickel alloy, silver, gold, copper, or the like. The leadframe may be characterized as a stamped leadframe formed by a stamping process or an etched leadframe formed by an etching process. A dashed outline label 118 indicates an outer perimeter location of an encapsulant at a subsequent stage of manufacture. Cross-sectional views of semiconductor device 100 taken along line A-A are shown in example stages of manufacture depicted in FIG. 2 through FIG. 6.

The flag 102 may be formed having any shape, size, or configuration suitable for an attachment of a semiconductor die. In this embodiments, the flag 102 and the plurality of leads 104 and 106 are formed in the same plane. In some embodiments, the flag 102 may be characterized as a downset flag where the plane of the flag 102 is below the plane of the plurality of leads. The plurality of leads 104 and 106 are configured and arranged to couple electrical signals between locations from outside of a finished semiconductor device package and locations within the package such as bond pads on a semiconductor die, for example.

The tie bars are configured and arranged to provide support for the semiconductor device 100 during a package assembly process. In this embodiment, the tie bars 110 extend from side rails 112 toward the flag 102 and remain separate from the flag 102. The tie bars 110 have proximal portion nearer to the side rails 112 and a distal portion farther from the side rails 112. In this embodiment, the distal portion is encapsulated during an encapsulation operation while the proximal portion remains substantially unencapsulated.

Figure 2:
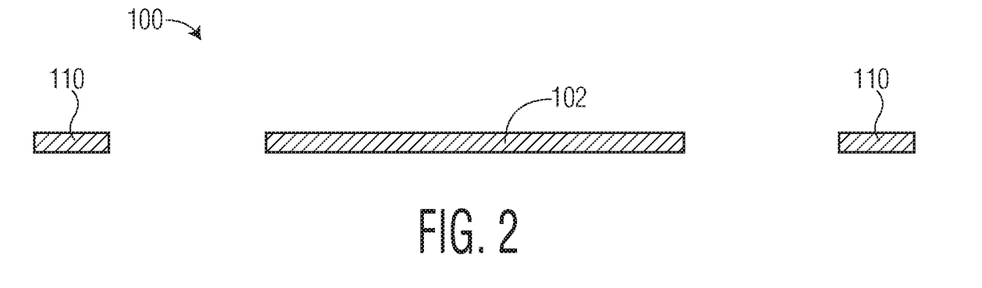
FIG. 2 through FIG. 6 illustrate, in simplified cross-sectional views, the example semiconductor device at stages of manufacture in accordance with an embodiment.

FIG. 2 illustrates, in a simplified cross-sectional view, the example semiconductor device 100 taken along line A-A at a stage of manufacture in accordance with an embodiment. The semiconductor device 100 depicted in FIG. 2 includes the tie bars 110 and the flag 102. At this stage, the tie bars 110 of the leadframe are in a same plane as the flag 102 of the leadframe. Side rails 112 are not show for illustration purposes.

Figure 3:
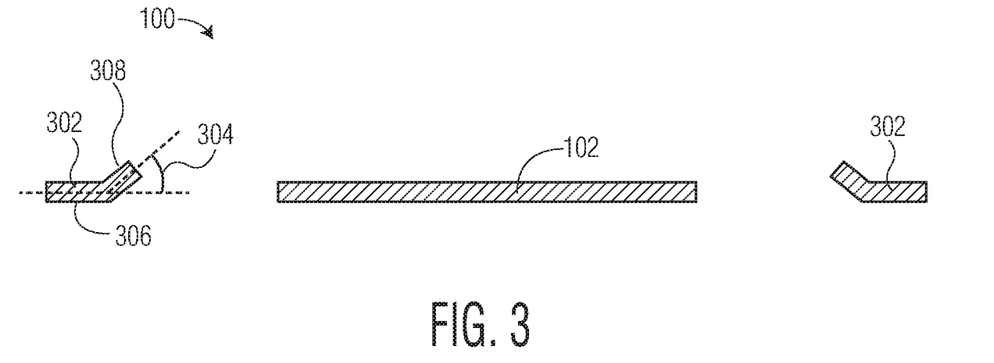

FIG. 3 illustrates, in a simplified cross-sectional view, the example semiconductor device 100 taken along line A-A at a subsequent stage of manufacture in accordance with an embodiment. At this stage, the semiconductor device 100 depicted in FIG. 3 includes the tie bars 302 having an angled portion and the flag 102. The tie bars 302 include a proximal portion 306 (nearer to side rails 112) and a distal portion 308 (farther from side rails 112). In this embodiment, the tie bars 302 are bent upward such that the distal portion 308 is at an angle 304 relative to the plane of the flag. The proximal portion 306 remains substantially in a same plane as the flag 102. In one embodiment, the tie bars 302 may be bent to form angled distal portion 308 during a leadframe stamping process. In another embodiment, the tie bars 302 may be bent to form angled distal portion 308 during a subsequent step after forming the leadframe. In this embodiment, the angle 304 of the distal portion 308 is at an angle different from a plane of the flag 102. For example, the angle 304 may be in a range of 30 to 60 degrees relative to the flag 102. In some embodiments, the angle 304 may be in a range of 15 to 75 degrees relative to the flag 102. In some embodiments, the tie bars 302 are bent downward such that the distal portion 308 is at a negative angle 304 relative to the plane of the flag.

Figure 4:
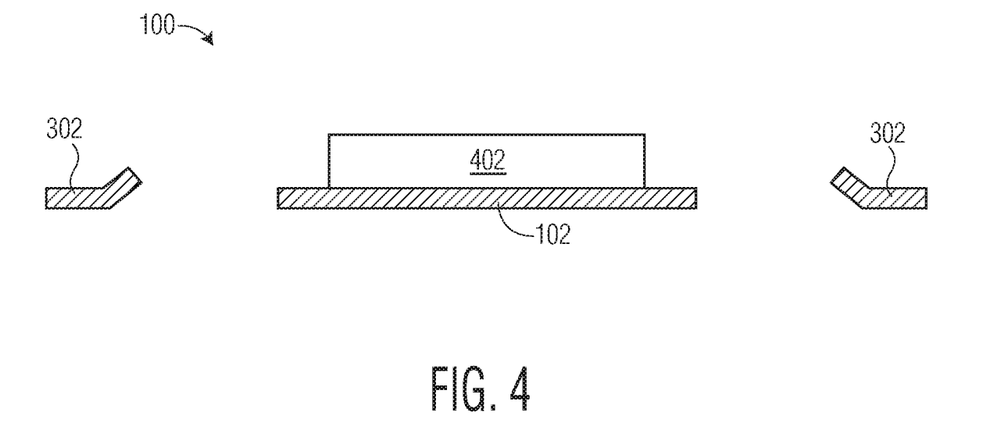

FIG. 4 illustrates, in a simplified cross-sectional view, the example semiconductor device 100 taken along line A-A at a subsequent stage of manufacture in accordance with an embodiment. At this stage, the semiconductor device 100 depicted in FIG. 4 includes a semiconductor die 402 attached to the flag 102. The semiconductor die 402 is attached to the flag 102 with a die-attach material (not shown). For example, the die-attach material may be a solder alloy, an epoxy, a conductive adhesive, or any suitable die-attach material such as a die-attach film. In some embodiments, semiconductor die 402 may be attached to the flag 102 by way of a eutectic bonding process or sintering process. The semiconductor die 402 may be formed from any suitable semiconductor material, such as silicon, germanium, gallium arsenide, gallium nitride and the like. Semiconductor die 402 may include any digital circuits, analog circuits, RF circuits, high voltage circuits, memory, signal processor, MEMS, sensors, the like, and combinations thereof. Bonding pads, bond wires, and the like to couple the semiconductor die 402 to the plurality of leads 104 and 106 are not shown for illustration purposes.

Figure 5:
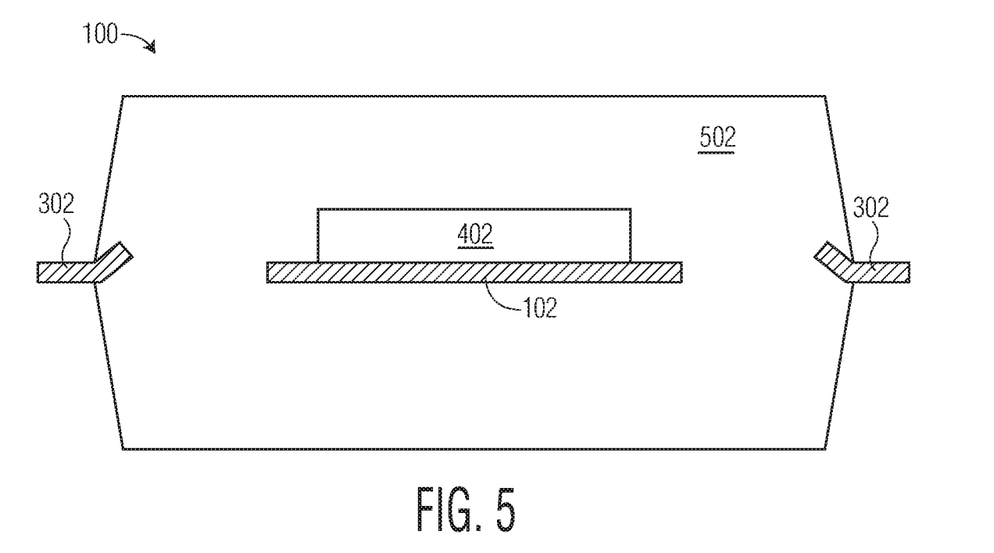

FIG. 5 illustrates, in a simplified cross-sectional view, the example semiconductor device 100 taken along line A-A at a subsequent stage of manufacture in accordance with an embodiment. At this stage, the semiconductor device 100 depicted in FIG. 5 includes an encapsulant 502 encapsulating the distal portions of the tie bars 302 and the semiconductor die 402 attached to the flag 102. In this embodiment, the encapsulant 502 may be an epoxy molding compound dispensed during an injection molding encapsulation operation. In this embodiment, the distal portions of the tie bars 302 are encapsulated while the proximal portions of the tie bars 302 remains substantially unencapsulated.

Figure 6:
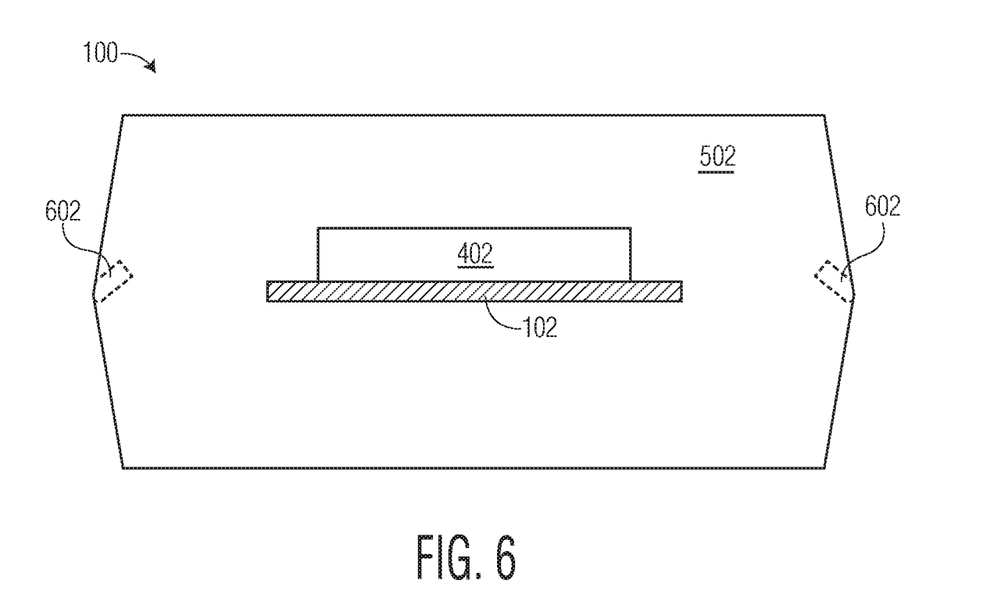

FIG. 6 illustrates, in a simplified cross-sectional view, the example semiconductor device 100 taken along line A-A at a subsequent stage of manufacture in accordance with an embodiment. At this stage, the semiconductor device 100 depicted in FIG. 6 includes cavities 602 in the encapsulant 502 encapsulating the semiconductor die 402 attached to the flag 102. During a tie bar separation operation, the tie bars 302 are extracted from the encapsulant 502 leaving behind angled cavities 602. In some embodiments, the tie bars 302 may be extracted from the encapsulant 502 during a singulation operation. The resulting angled cavities 602 are at an angle different from the plane of the flag 102. In one embodiment, the angled cavities 602 have a cavity shape substantially corresponding to the encapsulated tie bar portion. For example, a tie bar having a rounded tip may leave a cavity in the encapsulant 502 having an innermost end with a rounded shape. It may be desirable to separate the tie bars 302 from the encapsulant 502 by applying a net force to the proximal portion of the tie bars 302 in direction opposite of the direction of the distal (angled) portions. For example, when the distal portions of tie bars are bent at an upward angle, it may be desirable to apply a net downward for to the proximal portions of the tie bars 302 thus improving package integrity and reliability. After separating the tie bars 302 from the encapsulant 502, creepage distance is significantly increased between each pair of leads of the plurality of leads 104 and 106 located at the tie bar ends of the semiconductor device 100. For example, after separating tie bars 302, creepage distance at a tie bar end of the semiconductor device 100 is increased between an end lead 114 of the first plurality of leads 104 and an end lead 116 of the second plurality of leads 106.

Figure 7:
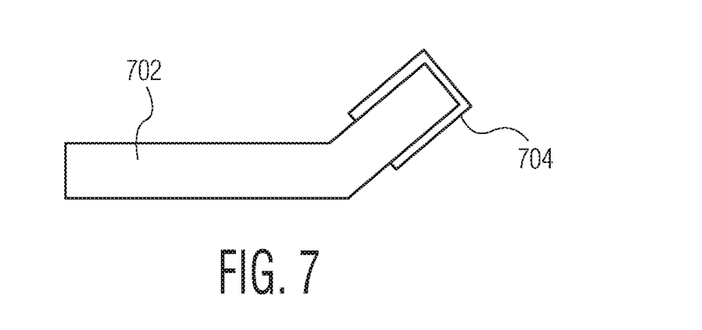
FIG. 7 through FIG. 9 illustrate, in simplified cross-sectional views, example alternative tie bar end configurations in accordance with an embodiment.
Figure 8:
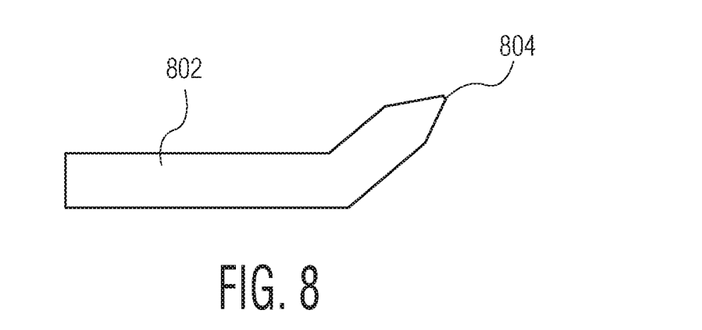
Figure 9:
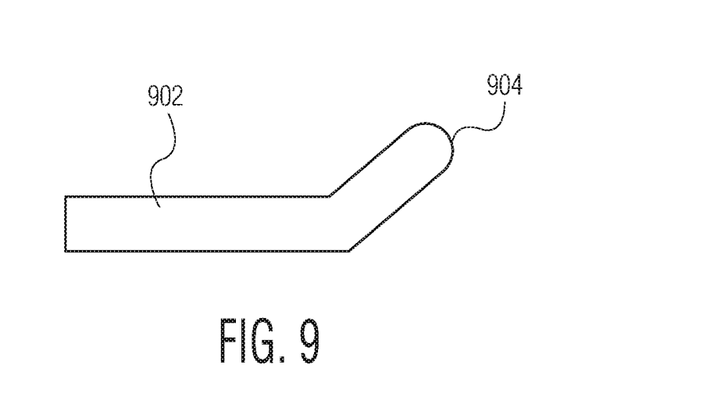

FIG. 7 through FIG. 9 illustrate, in simplified cross-sectional views, example alternative tie bar end configurations in accordance with an embodiment. In the embodiments of FIG. 7 through FIG. 9, alternative tie bar end configurations are depicted corresponding to tie bars 302. For example, a tie bar 702 of FIG. 7 is configured with a coating or plating 704 at the distal end of tie bar 702. The coating or plating 704 may be formed from any suitable low adhesion material (e.g., silver, gold, nickel, palladium) to facilitate separating the tie bar 702 from an encapsulant during a tie bar separation operation. The alternative tie bar 802 of FIG. 8 is configured with a tetrahedron or pyramid structure 804 formed at the distal end of tie bar 802. The tetrahedron or pyramid structure 804 may be formed having angles suitable to facilitate separating the tie bar 802 from an encapsulant during a tie bar separation operation. The alternative tie bar 902 of FIG. 9 is configured with a semi-spherical or semi-cylindrical structure 904 formed at the distal end of tie bar 902. The semi-spherical or semi-cylindrical structure 904 may be formed having a radius and taper suitable to facilitate separating the tie bar 902 from an encapsulant during a tie bar separation operation. In some embodiments, the alternative tie bar tips 804 and 904 may be coated or plated with a suitable low adhesion material to further facilitate separating the tie bars (802, 902) from an encapsulant during a tie bar separation operation.

Figure 10:
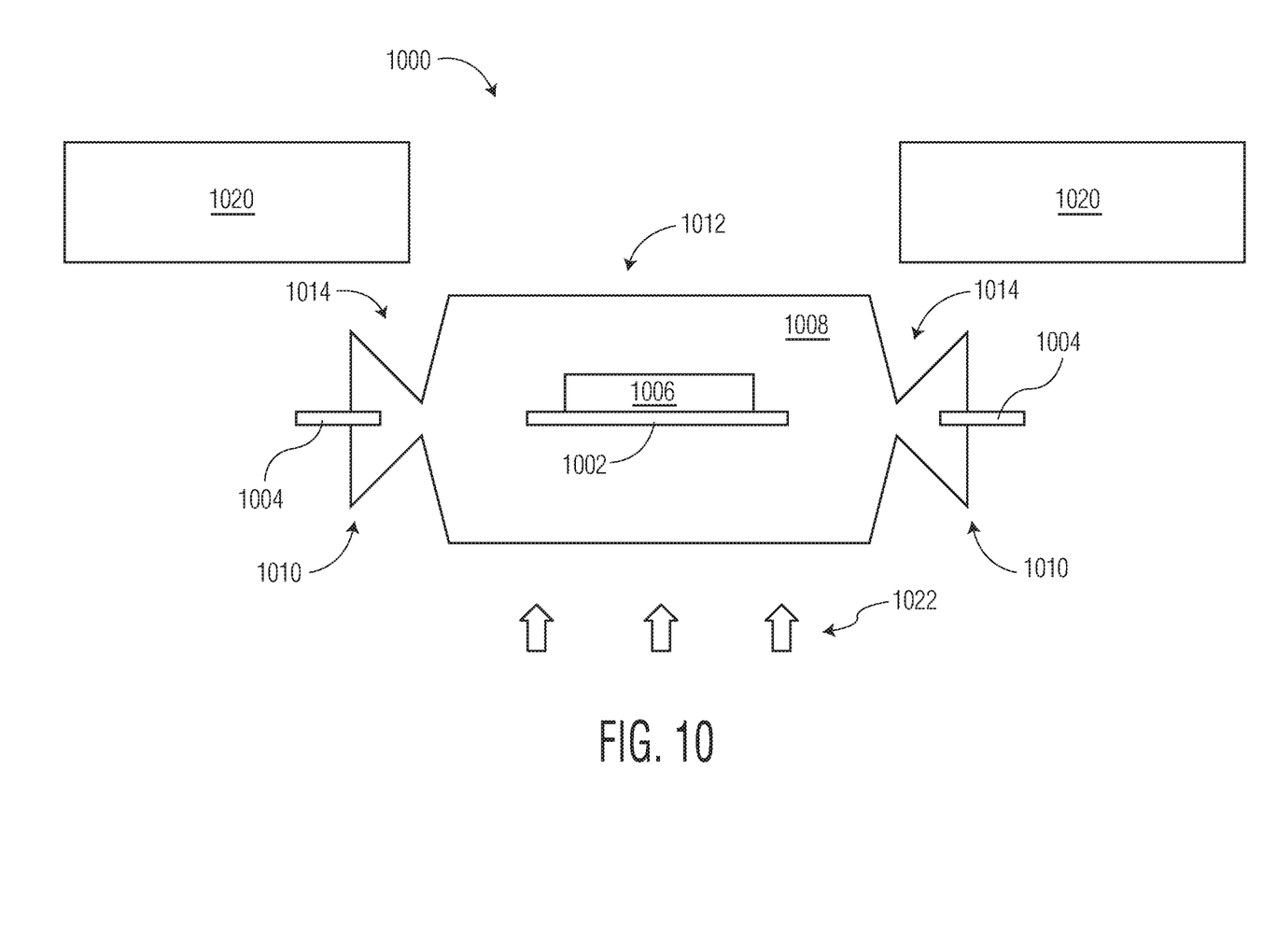
FIG. 10 and FIG. 11 illustrate, in simplified cross-sectional views, an alternative example semiconductor device at stages of manufacture in accordance with an embodiment.

FIG. 10 illustrates, in a simplified cross-sectional view, an alternative example semiconductor device 1000 taken along line A-A of FIG. 1 at a stage of manufacture in accordance with an embodiment. At this stage, the semiconductor device 1000 depicted in FIG. 10 includes an encapsulant 1008 encapsulating distal portions of tie bars 1004 and a semiconductor die 1006 attached to a leadframe flag 1002. A body portion 1012 of the encapsulant 1008 encapsulates the semiconductor die 1006 and the flag 1002, and dog-ear portions 1010 of the encapsulant encapsulates the distal portions of the tie bars 1004. A thinned portion 1014 of the encapsulant 1008 connects the body portion 1012 and the dog-ear portions 1010. The thinned portion 1014 of encapsulant 1008 is further configured and arranged to facilitate separating the dog-ear portions 1010 from the body portion 1012. In this embodiment, the encapsulant 1008 may be an epoxy molding compound dispensed during an injection molding encapsulation operation.

The leadframe of semiconductor device 1000 may be formed from any suitable electrically conductive material, such as aluminum, copper, silver, nickel, or iron, or alloys thereof, for example. The conductive metal may be bare, partially plated, or plated with another metal or an alloy such as iron/nickel alloy, silver, gold, copper, or the like. The leadframe may be characterized as a stamped leadframe formed by a stamping process or an etched leadframe formed by an etching process. The flag 1002 may be formed having any shape, size, or configuration suitable for an attachment of the semiconductor die 1006. In this embodiments, the flag 1002 and tie bars 1004 are formed in the same plane. In some embodiments, the flag 1002 may be characterized as a down-set flag where the plane of the flag 1002 is below the plane of the tie bars 1004, for example. The tie bars 110 are configured and arranged to provide support for the semiconductor device 1000 during a package assembly process. In this embodiment, the tie bars 1004 extend from side rails of the leadframe toward the flag 1002 and remain separate from the flag 1002. The tie bars 1004 have proximal portion nearer to the side rails and a distal portion farther from the side rails. In this embodiment, the distal portion is encapsulated during an encapsulation operation while the proximal portion remains substantially unencapsulated.

The semiconductor die 1006 is attached to the flag 1002 with a die-attach material (not shown). For example, the die-attach material may be a solder alloy, an epoxy, a conductive adhesive, or any suitable die-attach material such as a die-attach film. In some embodiments, semiconductor die 1006 may be attached to the flag 1002 by way of a eutectic bonding process or sintering process. The semiconductor die 1006 may be formed from any suitable semiconductor material, such as silicon, germanium, gallium arsenide, gallium nitride and the like. Semiconductor die 1006 may include any digital circuits, analog circuits, RF circuits, high voltage circuits, memory, signal processor, MEMS, sensors, the like, and combinations thereof. Bonding pads, bond wires, and the like to couple the semiconductor die 1006 to a plurality of leads 104 and 106 on the leadframe are not shown for illustration purposes.

At this stage, the semiconductor device 1000 is located in a tie bar separation fixture 1020. As depicted in FIG. 10, the fixture 1020 is positioned above the encapsulated semiconductor device 1000. With an upward force indicated by arrows 1022, the dog-ear portions 1010 can be separated from the body portion 1012.

Figure 11:
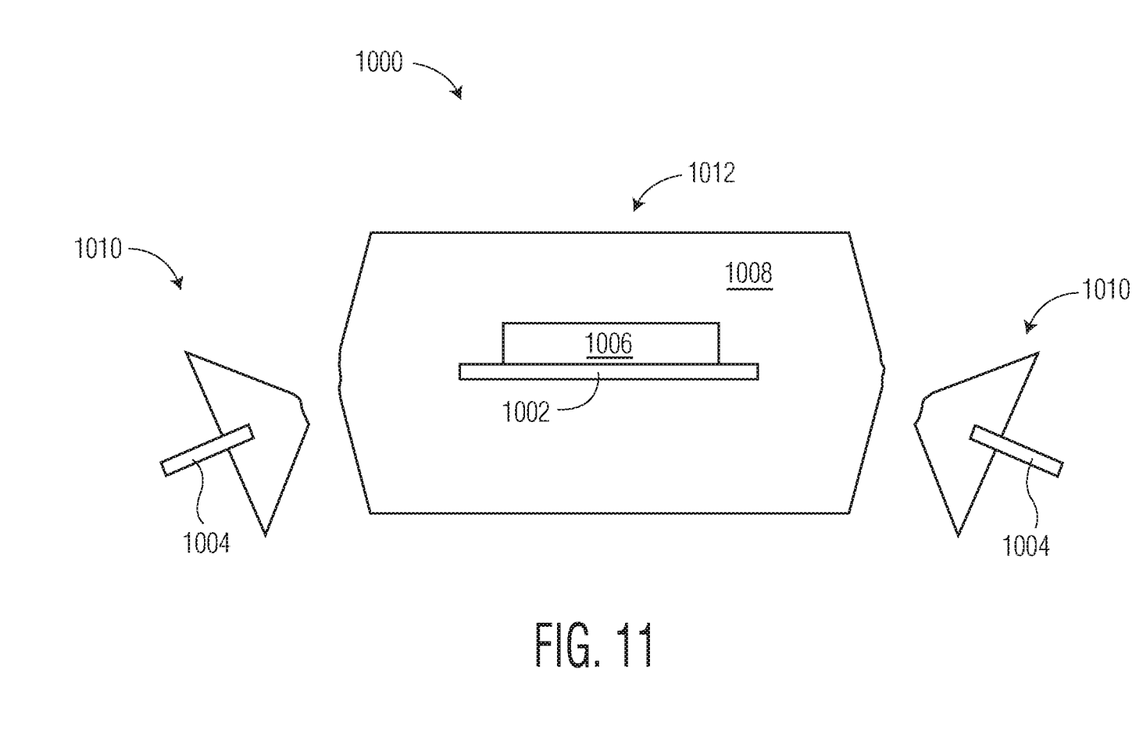

FIG. 11 illustrates, in a simplified cross-sectional view, the alternative example semiconductor device 1000 at a subsequent stage of manufacture in accordance with an embodiment. At this stage, the semiconductor device 1000 depicted in FIG. 11 includes the body portion 1012 of the encapsulant 1008 encapsulating the semiconductor die 1006 and the flag 1002. The dog-ear portions 1010 are separated from the body portion 1012 at the thinned portions 1014 by way of breaking the dog-ear portions 1010 away from the body portion 1012. After the dog-ear portions 1010, including the tie bars 1004, are separated from the body portion 1012, creepage distance is significantly increased between each pair of end leads of a plurality of leads (e.g., plurality of leads 104 and 106) located at the tie bar ends of the semiconductor device 1000.

Generally, there is provided, a method including forming a leadframe including a tie bar and a flag, the tie bar extending from a side rail and having a distal portion at an angle different from a plane of the flag; attaching a semiconductor die to the flag of the leadframe; encapsulating with a molding compound the semiconductor die, a portion of the leadframe, and the distal portion of the tie bar; and separating the tie bar from the molding compound, an angled cavity remaining in the molding compound. The distal portion may be formed at an angle in a range of 15 to 75 degrees relative to the plane of the flag. The method may further include applying a low adhesion material to the distal portion of the tie bar. The applying the low adhesion material to the distal portion of the tie bar may include plating the distal portion of the tie bar with a silver, gold, palladium, or nickel material. A tip of the distal portion of the tie bar may include a tetrahedron or pyramid structure. The separating the tie bar from the molding compound may occur during a singulation operation. The forming the leadframe may occur during a leadframe stamping process. The separating the tie bar from the molding compound may increase the creepage distance between an end conductive lead of a first plurality of leadframe leads and an end conductive lead of a second plurality of leadframe leads.

In another embodiment, there is provided, a method including providing a leadframe including a plurality of conductive leads, a tie bar, and a flag, the tie bar extending from a side rail of the leadframe; bending to form a distal portion of the tie bar at an angle different from a plane of the flag; attaching a semiconductor die to the flag of the leadframe; encapsulating with a molding compound the semiconductor die, a portion of the leadframe, and the distal portion of the tie bar; and separating the tie bar from the molding compound, an angled cavity remaining in the molding compound. The distal portion may be formed at an angle in a range of 15 to 75 degrees relative to the plane of the flag. The method may further include applying a low adhesion material to the distal portion of the tie bar. The applying the low adhesion material to the distal portion of the tie bar may include coating the distal portion of the tie bar with material including silver, gold, or nickel. A tip of the distal portion of the tie bar may include a semi-spherical or semi-cylindrical structure. The separating the tie bar from the molding compound may occur during a singulation operation. The bending the distal portion of the tie bar at the angle different from the plane of the flag may occur during a leadframe stamping process. The separating the tie bar from the molding compound may increase the creepage distance between two conductive leads of the plurality of conductive leads.

In yet another embodiment, there is provided, a semiconductor device including a leadframe having a plurality of conductive leads and a flag; a semiconductor die attached to the flag of the leadframe; and a molding compound encapsulating the semiconductor die and a portion of the leadframe, an angled cavity formed in the molding compound at an end of the semiconductor device, the angled cavity formed at an angle different from a plane of the flag. The angle of the angled cavity may be in a range of 15 to 75 degrees relative to the plane of the flag. An innermost end of the angled cavity may include a tetrahedron or pyramid shape. An innermost end of the angled cavity may include a semi-spherical or semi-cylindrical shape.

By now it should be appreciated that there has been provided, a tie bar removal method for semiconductor device packaging. By forming a leadframe to facilitate tie bar separation, creepage distance can increased while minimizing impact to package encapsulant. In one aspect, leadframe tie bars are bent at an angle different from the plane of a die flag. Separating the bent tie bars from the package encapsulant with a force applied in an opposite direction significantly improves package integrity and reliability. In another aspect, leadframe tie bars are encapsulated in a sacrificial portion of the molded package. Separating the sacrificial portion also removes the tie bars leaving minimal impact to the package encapsulant and improving overall package integrity and reliability.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
    forming a leadframe including a tie bar and a flag, the tie bar extending from a side rail and having a distal portion at an angle different from a plane of the flag;
    attaching a semiconductor die to the flag of the leadframe;
    encapsulating with a molding compound the semiconductor die, a portion of the leadframe, and the distal portion of the tie bar; and
    separating the tie bar from the molding compound, an angled cavity remaining in the molding compound.

2. The method of claim 1, wherein the distal portion is formed at an angle in a range of 15 to 75 degrees relative to the plane of the flag.

3. The method of claim 1, further comprising applying a low adhesion material to the distal portion of the tie bar.

4. The method of claim 3, wherein applying the low adhesion material to the distal portion of the tie bar comprises plating the distal portion of the tie bar with a silver, gold, palladium, or nickel material.

5. The method of claim 1, wherein a tip of the distal portion of the tie bar comprises a tetrahedron or pyramid structure.

6. The method of claim 1, wherein separating the tie bar from the molding compound occurs during a singulation operation.

7. The method of claim 1, wherein forming the leadframe occurs during a leadframe stamping process.

8. The method of claim 1, wherein separating the tie bar from the molding compound increases a creepage distance between an end conductive lead of a first plurality of leadframe leads and an end conductive lead of a second plurality of leadframe leads.

9. A method comprising:
    providing a leadframe including a plurality of conductive leads, a tie bar, and a flag, the tie bar extending from a side rail of the leadframe;
    bending to form a distal portion of the tie bar at an angle different from a plane of the flag;
    attaching a semiconductor die to the flag of the leadframe;
    encapsulating with a molding compound the semiconductor die, a portion of the leadframe, and the distal portion of the tie bar; and
    separating the tie bar from the molding compound, an angled cavity remaining in the molding compound.

10. The method of claim 9, wherein the distal portion is formed at an angle in a range of 15 to 75 degrees relative to the plane of the flag.

11. The method of claim 9, further comprising applying a low adhesion material to the distal portion of the tie bar.

12. The method of claim 11, wherein applying the low adhesion material to the distal portion of the tie bar comprises coating the distal portion of the tie bar with material including silver, gold, or nickel.

13. The method of claim 9, wherein a tip of the distal portion of the tie bar comprises a semi-spherical or semi-cylindrical structure.

14. The method of claim 9, wherein separating the tie bar from the molding compound occurs during a singulation operation.

15. The method of claim 9, wherein bending the distal portion of the tie bar at the angle different from the plane of the flag occurs during a leadframe stamping process.

16. The method of claim 9, wherein separating the tie bar from the molding compound increases a creepage distance between two conductive leads of the plurality of conductive leads.

* * * * *